United States Patent [19]
Maloney

[11] Patent Number: 6,007,880
[45] Date of Patent: Dec. 28, 1999

[54] METHOD FOR GENERATING A CERAMIC COATING

[75] Inventor: Michael J. Maloney, Port St. Lucie, Fla.

[73] Assignee: United Technologies Corporation, Hartford, Conn.

[21] Appl. No.: 09/118,289

[22] Filed: Jul. 17, 1998

[51] Int. Cl.⁶ .................................................. C23C 8/00
[52] U.S. Cl. ................. 427/585; 427/250; 427/255.395; 427/294; 427/566
[58] Field of Search .................................. 427/566, 585, 427/250, 255.395, 294

[56] References Cited

U.S. PATENT DOCUMENTS

| | | | |
|---|---|---|---|
| 4,321,311 | 3/1982 | Strangman | 428/623 |
| 4,328,285 | 5/1982 | Siemers et al. | 428/633 |
| 4,405,659 | 9/1983 | Strangman | 427/248.1 |
| 4,405,660 | 9/1983 | Ulion et al. | 427/248.1 |
| 4,599,270 | 7/1986 | Rangaswamy et al. | 428/402 |
| 4,719,080 | 1/1988 | Duhl et al. | 420/443 |
| 4,902,572 | 2/1990 | Horne et al. | 428/409 |
| 5,079,224 | 1/1992 | Higuchi | 505/1 |
| 5,087,477 | 2/1992 | Giggins, Jr. et al. | 427/38 |
| 5,262,245 | 11/1993 | Ulion et al. | 428/469 |
| 5,296,274 | 3/1994 | Movchan et al. | 427/566 |
| 5,334,462 | 8/1994 | Vine et al. | 428/697 |
| 5,378,500 | 1/1995 | Ward-Close et al. | 427/250 |
| 5,384,200 | 1/1995 | Giles et al. | 428/552 |
| 5,429,843 | 7/1995 | Masaki et al. | 427/534 |
| 5,514,482 | 5/1996 | Strangman | 428/623 |
| 5,662,965 | 9/1997 | Deguchi et al. | 427/249 |
| 5,687,679 | 11/1997 | Mullin et al. | 123/41.79 |
| 5,792,521 | 8/1998 | Wortman | 427/567 |

FOREIGN PATENT DOCUMENTS 799 904 A1  8/1997  European Pat. Off. .

OTHER PUBLICATIONS

Duh, Jeno–Gong, Hsu, W.Y, and Chiou, Bi–Shiou; "Study on Rare–Earth–Oxide–Doped Yttria Tetragonal Zirconia," *High Tech Ceramics,* Elsevier Publishers B.V., Amsterdam, 1987, 8 pages. (No month avail.).

*Primary Examiner*—Bernard Pianalto
*Attorney, Agent, or Firm*—Tyler Morrison

[57] ABSTRACT

A method is disclosed for generating a ceramic coating on a superalloy substrate. A first constituent of the coating and a second constituent of the coating are provided separate from one another, and preferably within a sealed chamber that has been evacuated. The first constituent and the second constituent are heated and evaporated to generate a first evaporant and a second evaporant, and form a vapor flux. The flux is then condensed on the article to generate the coating.

25 Claims, 3 Drawing Sheets

METHOD FOR GENERATING A CERAMIC COATING

TECHNICAL FIELD

The present invention relates to thermal barrier coatings (TBCs) and relates more particularly to a method for generating ceramic TBCs.

BACKGROUND OF THE INVENTION

Electron beam physical vapor deposition (EB-PVD) is one method for coating substrates or other components with thin layers of columnar grain coatings, and is typically performed within a sealed chamber that is maintained at a low gas pressure. The application of ceramic TBCs to substrates fabricated from superalloys is known, for example from U.S. Pat. No. 4,321,311 to Strangman, which discloses columnar grain ceramic thermal barrier coatings; U.S. Pat. No. 4,405,659 to Strangman, which discloses a method for producing columnar grain ceramic TBCs; U.S. Pat. No. 4,405,660 to Ulion et al, which discloses a method for producing metallic articles having durable ceramic TBCs; and U.S. Pat. No. 5,087,477 to Giggins, Jr. et al., which discloses an EB-PVD method for applying ceramic coatings.

During EB-PVD, an electron beam impinges upon a coating target provided in solid form, e.g., as a stick or rod of material. The target is held in a cooled crucible, generally in the shape of a hollow cylinder. The beam heats the exposed end of the target, thereby forming a molten pool of target material. The material vaporizes, and the vapor or evaporant fills the chamber and condenses upon the surface of the substrate to form the coating. One such target/coating material is yttria stabilized zirconia (YSZ), which is characterized by constituents having similar vapor pressures. Accordingly, the constituents tend to vaporize at similar rates, and the composition of the resultant TBC corresponds to the composition of the target.

The general purpose of TBCs is, of course, to reduce heat flow into the component, thereby protecting the substrate. In aircraft applications, and particularly with respect to the first several turbine stages, turbine blades and vanes are subjected to gas temperatures of up to 2500–3000° F., which are well above the melting point of the underlying substrate. The TBC therefore must have a low thermal conductivity and usually the component must also be cooled. However, providing cooling to the component reduces the operating efficiency of the turbine. YSZ has a thermal conductivity of about 20 Btu-in./(hr-ft$^2$-° F.) or 2.3 W/(m-° C.). While YSZ has served as a satisfactory TBC for a number of years, lower thermal conductivity TBCs are desired.

One known target/coating material is yttria stabilized zirconia (YSZ), which is characterized by constituents having similar vapor pressures. Accordingly, the constituents tend to vaporize at similar rates, and the composition of the resultant coating corresponds to the composition of the target. YSZ has a thermal conductivity of about 20 Btu-in./(hr-ft$^2$-° F.) or 2.3 W/(m-° C.). While YSZ has served as a satisfactory TBC for a number or years, lower thermal conductivity TBCs are desired.

A TBC having lower thermal conductivity offers several advantages for aircraft and other gas turbine applications. Given a constant TBC thickness and gas temperature, blade/vane temperatures are lowered thereby extending blade/vane life. Given a constant coating thickness and metal temperature, higher gas temperatures are possible thereby improving efficiency. Given a constant gas temperature and constant metal temperature, thinner coatings may be utilized, which greatly reduces the pull exerted by a rotating blade and enables use of smaller, lighter disks and/or increased creep life. Moreover, thinner coatings are expected to be more durable than thinner coatings, to the extent that thermal stresses in the thicker coatings are believed to contribute to TBC failure. Variations of the above, e.g., application of a somewhat thinner TBC and operation at a somewhat higher gas temperature, may also be desirable.

In an effort to generate TBCs having improved characteristics such as reduced thermal conductivity, other combinations of constituents have been utilized. U.S. Pat. No. 5,334,462 to Vine et al. discloses a ceramic insulating material and insulating coating made thereof. The coating material is a yttria strengthened ceria. The addition of a small amount of yttria, e.g., 0.5 w/o (0.5 percent by weight) significantly hardens the ceria, and provides a material which is useful as a TBC. It was suggested that the above-noted beneficial effects of yttria strengthened ceria apply up to, or even above, the solid solubility limit of yttria in ceria, which is about 12 w/o yttria.

Test applications of this material applied by EB-PVD, in which a unitary, solid source of yttria and ceria target material is employed, indicate that EB-PVD does not provide TBCs with a percentage of yttria comparable to the target. It is believed that since the ceria has a significantly higher vapor pressure than yttria, the resulting TBC necessarily has a significantly lower weight percentage of yttria than does the target. As noted in Vine et al., a target having 9 w/o yttria results in a TBC having only 0.5 w/o yttria using the above-described EB-PVD techniques. Moreover, solid single source targets of constituents which are not miscible, tend to crack during heating due to the thermal gradients that are generated between the two distinct constituents.

In addition, it is preferable that TBCs also exhibit erosion resistance.

It is a general object of the present invention to provide a method for producing vapor fluxes of two or more evaporants to form TBCs.

It is a more specific object of the invention to provide a method in which the amounts of the constituents in the flux are adjustable, thereby enabling adjustment of the composition of the resultant TBC.

It is another object of the invention to provide a method for generating TBCs from constituents having significantly different vapor pressures, such as yttria and ceria

SUMMARY OF THE INVENTION

The present invention relates to a method of generating a ceramic coating on a superalloy article. The method includes the steps of providing a first constituent of the coating and a second constituent of the coating within a sealed chamber maintained at a low gas pressure; separately evaporating the first constituent and the second constituent to form a first evaporant and a second evaporant so as to form a vapor flux of the first evaporant and the second evaporant; and condensing the flux on the constituent to generate the coating on the article.

DETAILED DESCRIPTION OF THE PREFERRED EMBODIMENT

Figure 1:
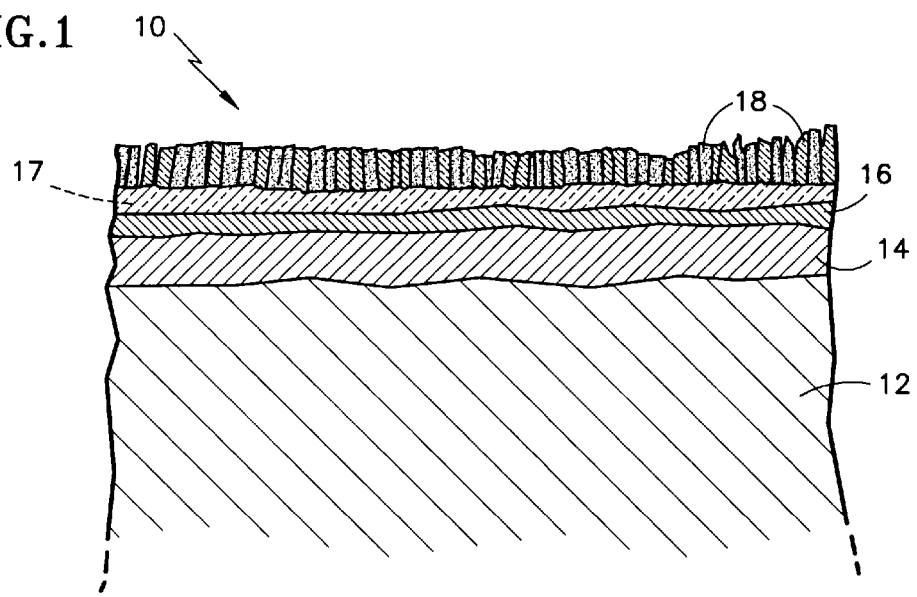
FIG. 1 is a cross sectional line drawing of an article having a TBC in accordance with the present invention.

Turning now to FIG. 1, which is not a scale drawing, a portion of an article according to the present invention is illustrated generally by the reference numeral 10. The article has a metallic bond coat, as well as a novel thermal barrier coating (TBC). U.S. Pat No. 4,405,659 to Strangman, U.S. Pat. No. 5,087,477 to Giggins et al. and U.S. Pat. No. 5,514,482 to Strangman generally describe the application of a metallic bond coat and a TBC to an article, such as an air cooled turbine article made from a superalloy material.

A substrate 12 such as a superalloy substrate is coated with a layer 14 of MCrAlY, intermetallic aluminide or other suitable material which serves as a metallic bond coat (if needed) between the metal substrate and the TBC. Preferably although not necessarily, the layer 14 thickness is between about 2 to 10 mils and is uniform. The layer may also be treated, e.g., by peening, polishing and/or heat treating, to densify any voids and to improve the structure of the coat and adherence to the substrate. A thin alumina layer 16 is formed on the metallic bond coat 14, although the alumina layer may be formed after application of the TBC; depending upon the particular material used for the substrate, the alumina layer may be formed directly on the substrate such that the application of a separate metallic bond coat is not necessary. See, e.g., U.S. Pat. No. 4,719,080 to Duhl and U.S. Pat. No. 5,262,245 to Ulion et al., both of which are assigned to the assignee of the present invention and expressly incorporated herein by reference. The TBC 18 is then deposited on the alumina layer, for example by electron beam physical vapor deposition (EB-PVD) or other suitable technique. Strangman '659 and Giggins et al. '477 discuss TBCs composed of yttria stabilized zirconia (YSZ). While the present invention has particular utility for generating a TBC from target materials having different vapor pressures, such as yttria and ceria, the present invention may equally be employed with other materials including materials having similar vapor pressures.

As noted in U.S. Pat. No. 5,334,462 to Vine et al., the addition of small amounts of yttria to ceria results in a material having desirable properties such as increased hardness. Vine suggests that the desirable properties are produced .%here the ceria has up to about 5 w/o (percent by weight) of yttria. Vine also notes that where yttria and ceria are deposited by EB-PVD, the composition of a target does not correspond generally to the composition of the resulting TBC. As an example, a target containing about 9 w/o yttria resulted in a TBC having only about 0.5 w/o yttria. Accordingly, the prior art suggests that it is not possible to continually increase the yttria content of the resulting TBC merely by increasing the yttria content of the target, particularly where the TBC is generated using EB-PVD.

In general, the present invention utilizes independent vaporization of physically separate target materials, to produce a mixture of evaporants and enable adjustment of the composition of the resulting TBC. Where one of the target materials has a vapor pressure significantly lower than the other material(s), it is possible to adjust the relative amounts of the materials vaporized, and thereby adjust the composition of the resulting TBC as desired. For example, where yttria and ceria are to be applied as a TBC using EB-PVD, the present invention permits the generation of a TBC having a yttria content significantly higher than was possible compared to the prior art.

Figure 2:
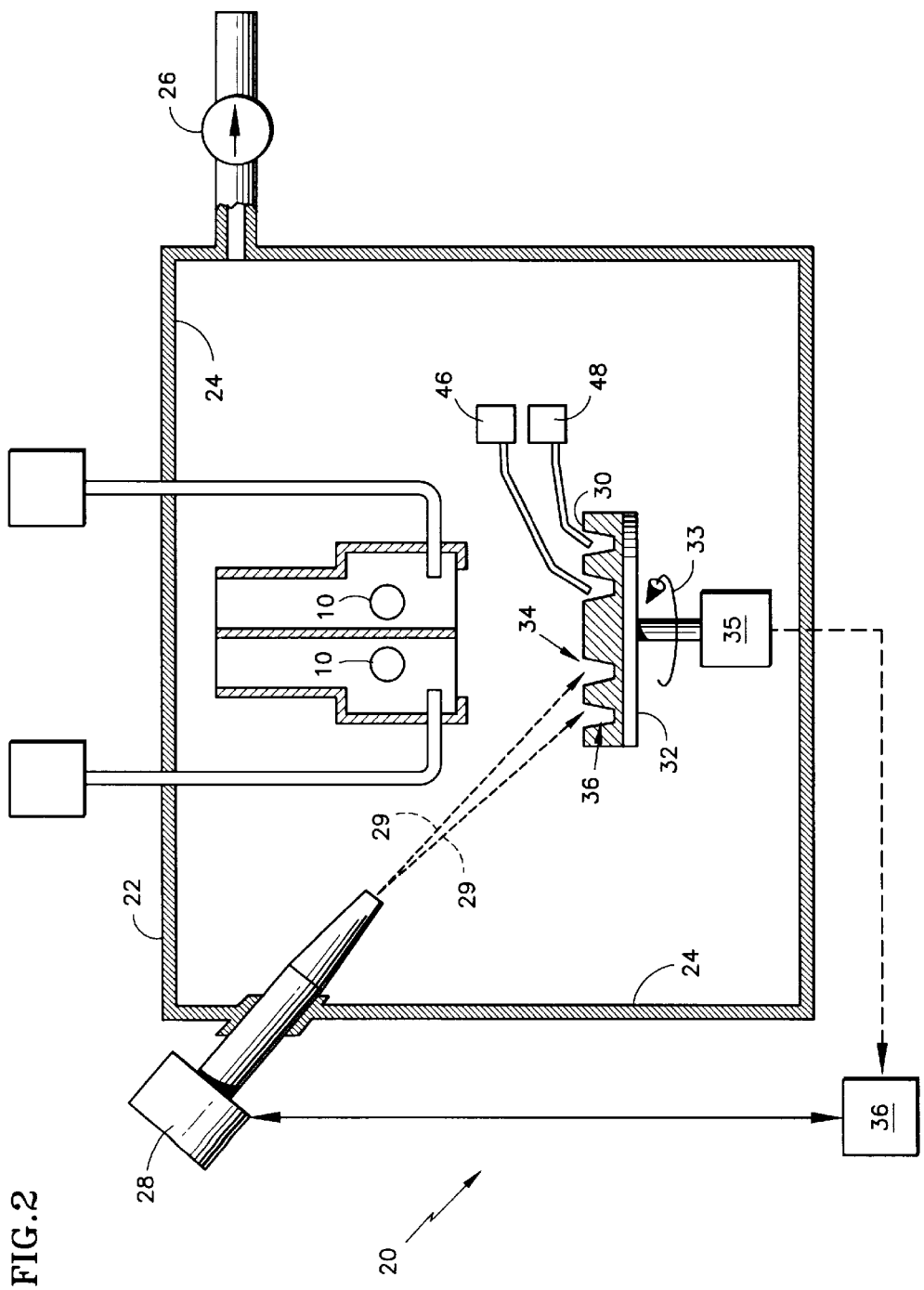
FIG. 2 is a schematic view of an apparatus for generating a TBC in accordance with the present invention, and illustrates a crucible of the present invention.

Turning now to FIG. 2, an apparatus 20 is shown for utilizing EB-PVD to generate a TBC from two target materials, such an yttria strengthened ceria TBC having a relatively high yttria content. Other apparatus, other application methods, such as sputtering, and other materials may also be utilized with the invention. In the illustrated case, portions of the apparatus 20 are similar to the apparatus shown and described in U.S. Pat. No. 5,087,477 to Giggins et al. and entitled "EB-PVD Method For Applying Ceramic Coatings", which is assigned to the assignee of the present invention and is expressly incorporated by reference herein. The apparatus 20 includes a sealed coating chamber 22 defined by walls 24, 24, and means 26 such as a vacuum unit for evacuating the chamber. At least one device, such as an electron beam gun 28, is provided for heating and evaporating any target materials contained in a crucible 30, which differs significantly from prior art crucibles.

A part 10 to be coated is held in spaced relation to the target and may be moved or otherwise manipulated with respect to the target, as is known in the art. The gun 28 includes a built-in magnetic field generator (not shown) for deflecting a beam 29 produced by the gun, as is known in the art. In the prior art, such deflection is utilized to scan the beam across the target material, which is typically cylindrical in shape and up to about 75 mm (3 in.) in diameter. The crucible 30 differs significantly from the prior art and is positioned on a carousel 32, which rotates the crucible to transport target material into the path of the beam, where the target material is vaporized, as described further below. The carousel is rotated as indicated by arrow 33 by a motor 35 under the direction of control unit 36 in the manner described below. While various target-to-substrate separations may be employed to produce a satisfactory TBC, we have used a separation of about 3.5 inches.

Figure 3A:
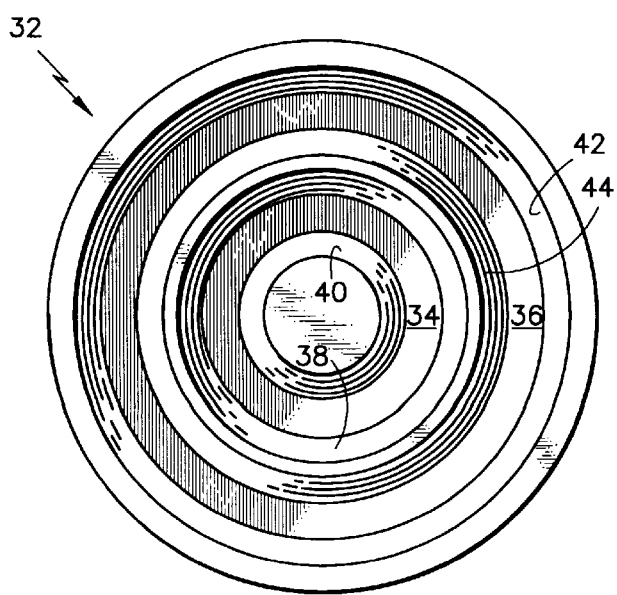
FIGS. 3a and 3b are additional views of the crucible of FIG. 2.
Figure 3B:
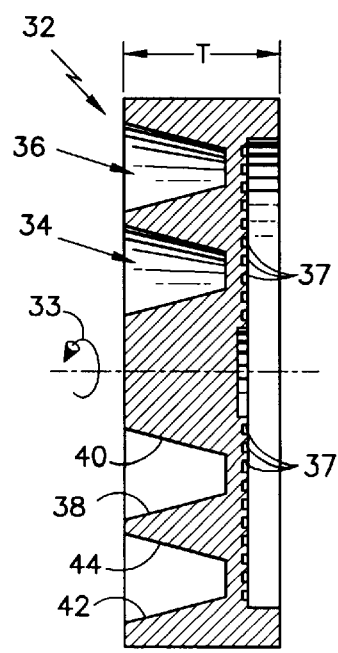

The crucible 30 is shown in greater detail in FIGS. 3a and 3b. The crucible is preferably fabricated from copper, and is liquid cooled as is known in the art. Liquid such as water is passed through cooling passages 37 provided in the crucible.

In a departure from the prior art crucibles, the crucible of the present invention provides two or more target materials separately from one another. In the preferred embodiment, the crucible is disk-shaped and defines a pair of channels 34, 36, although more channels could be provided. The channels receive separate or physically distinct constituents of the TBC, and are physically separate from, but adjacent to one another. In the illustrated case, one channel 34 contains yttria and the other channel 36 contains ceria.

If desired, additional channels could be provided, or the constituents could incorporate amounts of other oxides, including but limited to zirconia, hafnia, lanthia, calcia and scandia. Evaporation, and subsequent condensation of these materials on a substrate will result in a TBC characterized by a limited substitution of these other oxides for yttria and/or ceria on the cation sublattice, which may produce other desirable properties in the TBC.

The particular dimensions of the crucible are not believed to be critical to the invention. The channels should be separated from one another sufficiently so that the constituents can be vaporized independently of one another. The channels should be in sufficiently close proximity that the vaporized materials can form a homogeneous mixture prior to condensing upon the article. The channels are preferably but not necessarily arcuate (more preferably circular) and concentric, to provide a continuous feed path to the beam while the carousel is rotated. The illustrated crucible 32 has a thickness T of about 1.5 inches, and the channels are each about an inch deep and defined by sloped walls 38, 40 and 42, 44. The bottom portion of the walls 38, 40 and 42, 44 of a given channel are separated from one another by about 0.5 inch, and the top portion of the wall 38 of one channel is separated from the adjacent wall 44 portion of the other channel by about 0.25 inch. If needed, target material is continuously added to the channels by hoppers 46, 48 of the respective constituent material, located away from where the material is vaporized.

As noted above, the yttria and ceria are provided in separate channels, and are provided as a "gravel", preferably having a particle size of at least about 2 mm and more preferably about 3–5 mm. Coarser material may also be used. When finer material has been used, the smaller particles have tended to be displaced from the channel during vaporization of adjacent material, e.g., the smaller particles tend to be blown from the channel prior to being vaporized. Accordingly, particles finer than about 2 mm, and preferably about 3 mm are not generally used. As noted above, additional yttria and ceria may be added to the crucible by hoppers 46, 48, or other suitable mechanisms.

Having described the apparatus, the operation of the apparatus is now described. With reference to FIG. 2, the part 10 to be coated has been formed, a metallic bond coat 14 (FIG. 1) has been applied (if appropriate) and the alumina layer 16 has been formed, as is known in the art.

The part 10 is placed in the chamber 22 and the chamber is evacuated to a pressure appropriate for the application of the TBC, typically less than about $10^{-4}$ torr. The TBC is then applied, for example by EB-PVD. Regardless of how the TBC is applied, it is believed to be important to control the substrate temperature during TBC application.

Where YSZ or YsCeO2 is applied by EB-PVD, the substrate temperature should be at least about 950° C. or 1750° F., although the actual temperature may vary by material and equipment operating parameters. The substrate is initially heated either by the gun or using external heaters (not shown), and heat is also supplied to the substrate indirectly by the gun during vaporization of the target, to maintain substrate temperature.

Test samples of yttria-strengthened-ceria ($YsCeO_2$) have indicated a relatively poor adherence of the TBC to the alumina layer where the substrate is not sufficiently heated during TBC application. The tests have also indicated that the heat produced during vaporization of yttria and ceria by EB-PVD is not sufficient to maintain proper substrate temperature. Accordingly, additional heaters should be employed.

We have found that applying a thin layer of a ceramic such as YSZ onto the alumina layer prior to applying the yttria and ceria provides an adequate adherent layer, or ceramic bond coat, for the yttria strengthened ceria layer, even if additional, external heaters are not employed to heat the substrate during application of the yttria and ceria or if the appropriate substrate temperature is otherwise not maintained.

In FIG. 1, the ceramic bond coat layer is indicated in dashed lines at 17. In one test, the layer was composed of 7YSZ applied by EB-PVD, and was about 0.5 mils thick although the layer may have a different thickness, e.g., up to several mils. The ceramic bond coat should be thick enough to ensure that the alumina layer is substantially completely covered; however, where the ceramic bond coat is used on a rotating part such as turbine blade the layer should be no thicker than necessary to effect this purpose, as this additional layer will contribute to significant blade pull. It is believed that sputtering will also provide a satisfactory YSZ ceramic bond coat layer. Microscopic examination of samples including the YSZ layer has indicated that epitaxial growth occurs across grain boundaries between the YSZ and the yttria strengthened ceria. Moreover, the YSZ layer offers some thermal resistance in the event that the outer TBC fails.

In order to apply a TBC using a mixture of two separate constituents, each of the constituents must be heated and vaporized. In the illustrated case, only a single electron beam gun is employed, and includes a built-in variable magnetic field generator for deflecting the beam, as is known in the art. An external magnetic field generator may be used in the event that the gun does not include a built-in magnetic field generator or if the built-in generator lacks desired operating characteristics. In the prior art, such deflection is utilized to more evenly heat a conventional target.

With reference to FIGS. 2 and 3b, the beam 29 is scanned back and forth between the channel 34 and the channel 36 to vaporize each of the target materials. The scan rate must be slow enough to enable the beam to impinge upon and vaporize the target material, but fast enough to ensure that both constituents exist simultaneously in vapor form in the chamber 22. We do not believe that the beam can be scanned too fast, apart from equipment limitations. If only one constituent exists as vapor at a given time, the resulting TBC is characterized by discrete layers of target material. As used herein, a "scan" includes one path of movement of the beam, from a starting point and over a constituent in one channel, translation of the beam to the other channel, over another constituent in the other channel, back over the another constituent and then back across the one constituent. We believe that it is preferable to scan the beam faster rather than slower, e.g., at least about 3 times per second and preferably at least about 10 times per second.

The time during which the beam impinges upon the target material, i.e., the dwell time of the beam, is important. A longer dwell time on the material provides more heat to that target, thereby vaporizing more of the target than does a shorter dwell time. The dwell time on each target may be adjusted based in part upon the relative vapor pressures of the target, as well as the desired TBC composition, e.g., the beam dwells longer on a material if it is desired to increase the content of that material in the TBC.

As the beam is being scanned, the carousel 32 is rotating. Rotation occurs fast enough to continuously provide material to be vaporized, but slowly enough to enable the beam to impinge repetitively upon and vaporize material. For the material and the crucible described above, the preferred rotation rate is about 3 rpm or less. Particle size will also affect the rate at which the carousel should be rotated, with larger particles generally requiring slower carousel rotation. Scanning the beam while rotating the crucible also helps prevent vaporization of crucible material, since the beam will not repeatedly dwell upon any one portion of the crucible for a significant time period. Both target materials exist in vapor form, such that the vapors are uniformly interspersed, e.g., the vapors form a generally homogeneous mixture, prior to condensing on the part and forming the TBC layer 18 (FIG. 1).

Figure 4:
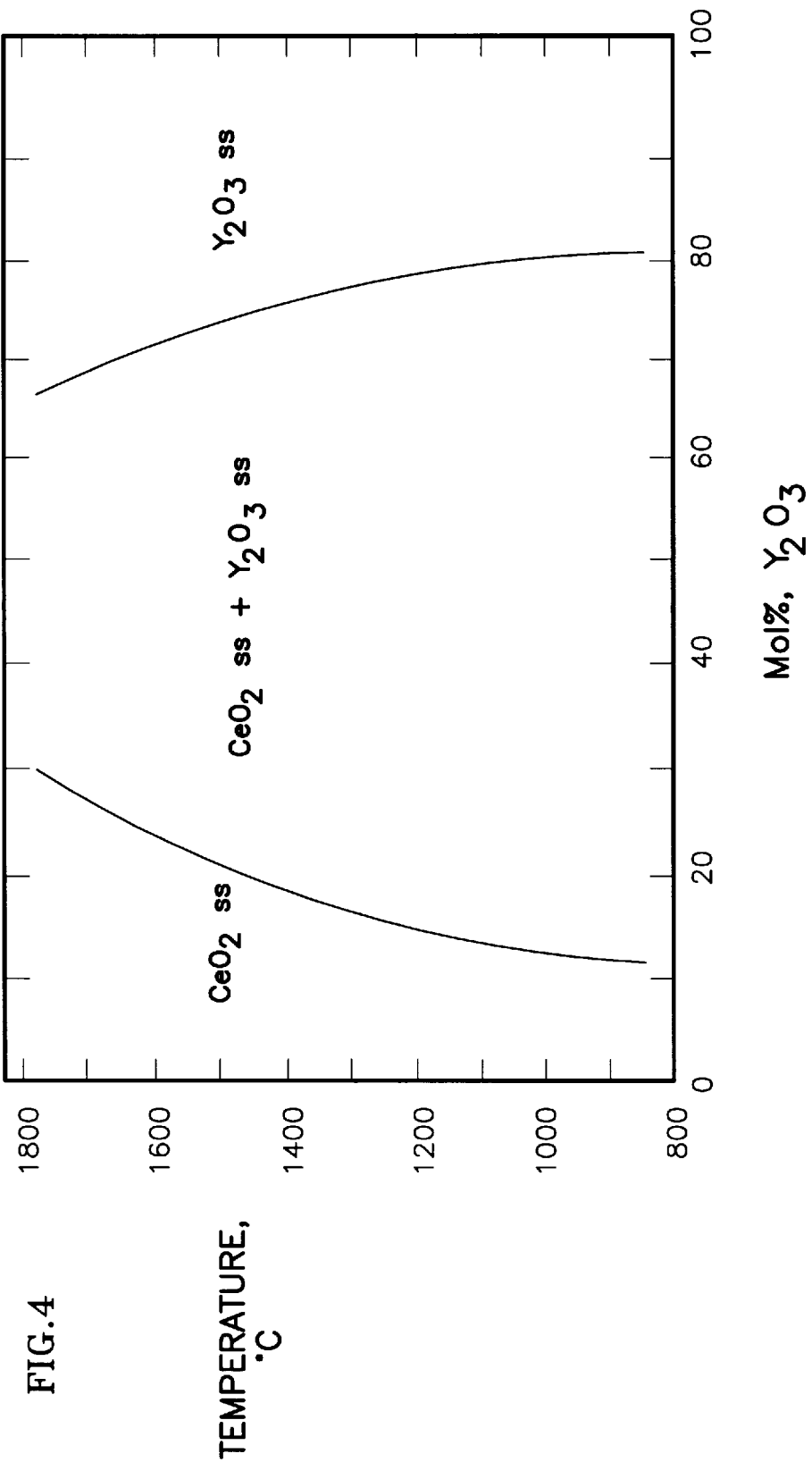
FIG. 4 is a portion of a phase diagram of yttria and ceria.

FIG. 4 shows a partial phase diagram for yttria and ceria. As indicated in the diagram, yttria and ceria having up to about 12 w/o (equivalent to about 9.4 mol. %) $YsCeO_2$ exists as a single phase and is stable up to at least about 2700° F. It is believed that the present invention can produce TBCs having substantially higher yttria content, e.g., greater than 12 w/o yttria, and that such TBCs may also have utility as TBCs even though the material may include multiple phases. As indicated in FIG. 4, such a TBC is expected to include more than one phase.

The thermal conductivity of columnar $YsCeO_2$ decreases with increasing temperature, at least within the range of between about 60–2200+° F. In other words, the thermal conductivity of $YsCeO_2$, specifically, 9 $YsCeO_2$ actually decreases significantly over that temperature range, from less than about 2.5 W/(m ° C.) at room temperature to less than about 1.0 above 2000° F. Increased yttria content of $YsCeO_2$ provides further reductions in thermal conductivity. We have tested samples of 50 $YsCeO_2$ (comprised of 50 w/o yttria and 50 w/o ceria), which was applied by EB-PVD, with favorable results. The samples had a thermal conductivity of between about 1.13–1.75 W/mK at about room temperature, and decreased to between about 0.73–0.95 W/mK at about 2200° F. While we do not foresee using $YsCeO_2$ with greater than about 60 w/o Ce, we do not rule out using higher ceria concentrations. While $YsCeO_2$ is slightly more dense than YSZ, about 10–15% more dense, the thermal conductivity of $YsCeO_2$ is typically less than about one half that of YSZ.

In contrast, a sample of 7 w/o YSZ has a generally constant thermal conductivity, of up to about 2.3 W/(m ° C.) over the same temperature range. As noted above with respect to FIG. 4, $YsCeO_2$ having up to at least about 12 w/o yttria also has greater phase stability generally than YSZ over the temperatures encountered in gas turbine applications.

In addition, tests performed using YSZ have indicated that as the concentration of yttria increases, the erosion resistance of the material decreases. In one test, samples of YSZ having 7, 12 and 20 w/o yttria were subjected to erosion testing using 27 micron alumina particles at 800 feet per second and 2000° F. The rate of erosion increased from the 7YSZ to the 12YSZ samples, and increased dramatically from the 12YSZ to the 20YSZ samples.

Tests indicate that the addition of some yttria enhances the erosion resistance of ceria. Surprisingly, the addition of more yttria in ceria further enhances erosion resistance, in contrast to the trend indicated above for increasing yttria content in YSZ. These tests also indicate that the samples of $7YsCeO_2$ are less erosion resistant that 7YSZ, but more erosion resistant than 20YSZ, and accordingly we would expect that $YsCeO_2$ would also be useful as an abradable, e.g., in an engine air seal and be applied by plasma spraying or other suitable thermal spray process. Moreover, the coefficient of thermal expansion of yttria strengthened ceria more closely follows the expansion of nickel based superalloys, e.g., the substrate, than does YSZ. Accordingly, it is expected that spallation due to different expansion rates will be reduced, particularly where a tinner TBC is applied. Tests confirm that a $YsCeO_2$ TBC, either applied directly to an alumina layer at a sufficiently high substrate temperature or applied to an intermediate YSZ layer, resists spalling at least as well as 7YSZ.

While the present invention has been described above in some detail, numerous variations and substitutions may be made without departing from the spirit of the invention or the scope of the following claims. For example, multiple beams may be used to evaporate the material, or the weight percentage of one material may be graded through the thickness of the coating, e.g., has a greater concentration of yttria adjacent the exposed surface of the TBC and a greater concentration of ceria adjacent the substrate. Accordingly, it is to be understood that the invention has been described by way of illustration and not by limitation.

What is claimed is:

1. A method of generating a ceramic, thermally insulating coating on an article, the method comprising the steps of:

providing a ceramic first target material and a second ceramic target material within a sealed chamber, the first and second target materials being provided separately from one another and in spaced relation to an article to be coated;

evaporating the first target material and the second target material and generating a vapor flux of the evaporants, the step of evaporating being performed by impinging an electron beam upon and scanning the electron beam between the first target and the second target thereby vaporizing the target materials independently of one another; and condensing the flux of the first evaporant and the second evaporant on the article.

2. The method of claim 1, wherein the provided article is composed of a superalloy material.

3. The method of claim 1, wherein the step of providing includes providing yttria and ceria.

4. The method of claim 1, wherein the target materials are provided as a gravel having a particle size of at least about 2 mm.

5. The method of claim 4, wherein the target materials are provided as a gravel having a particle size of between about 3–5 mm.

6. The method of claim 1, wherein the first and second target materials are evaporated and condensed to produce a coating on the article composed of at least about 3 w/o yttria balance substantially ceria.

7. The method of claim 6, wherein the coating is composed of between about 5–12 w/o yttria.

8. The method of claim 1, wherein the electron beam impinges on the yttria longer than on the ceria.

9. The method of claim 1, wherein the electron beam is scanned between the first target and the second target at least three times per second.

10. The method of claim 1, wherein the first target and the second target are provided on separate, endless feedpaths.

11. The method of claim 1, further comprising the step of providing additional amounts of the first target and the second target.

12. The method of claim 1, further comprising the step of generating an intermediate layer of ceramic material on the article prior to the step of evaporating.

13. The method of claim 1, wherein the intermediate layer is composed of yttria and zirconia.

14. A method of generating a ceramic, thermally insulating coating on an article, the method comprising the steps of:

providing yttria and ceria separately from one another as target materials within a sealed chamber maintained at a low gas pressure;

evaporating the yttria and ceria to generate a mixture of yttria and ceria vapors, wherein the step of evaporating is performed by impinging an electron beam upon and scanning the beam between the yttria and the ceria; and condensing the mixture on the article.

15. The method of claim 14, wherein the coating on the article is composed of at least about 3 w/o yttria balance substantially ceria.

16. The method of claim 15, wherein the coating is composed of between about 5–12 w/o yttria.

17. The method of claim 16, wherein the yttria and ceria are evaporated independently of one another.

18. The method of claim 14, wherein the yttria and ceria are provided as a gravel having a particle size of at least about 2 mm.

19. The method of claim 14, further comprising the step of generating an intermediate layer of ceramic material on the article prior to the step of evaporating.

20. The method of claim 14, wherein the intermediate layer is composed of yttria and zirconia.

21. The method of claim 14, wherein the electron beam is scanned between the yttria and ceria at least about three times per second.

22. The method of claim 14, wherein the electron beam impinges on the yttria and the ceria for different time periods.

23. The method of claim 14 further comprising the step of: providing additional yttria and ceria.

24. The method of claim 14, wherein the yttria and ceria are provided in separate, endless feedpaths.

25. The method of claim 14, wherein the amounts of the yttria and the ceria evaporated are adjusted in order to provide a graded coating during the step of condensing.

* * * * *